(12) United States Patent
Khlat

(10) Patent No.: US 12,355,407 B2
(45) Date of Patent: *Jul. 8, 2025

(54) CIRCUIT AND METHOD FOR INTRA-SYMBOL VOLTAGE MODULATION

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 271 days.

This patent is subject to a terminal disclaimer.

(21) Appl. No.: 17/946,470

(22) Filed: Sep. 16, 2022

(65) Prior Publication Data

US 2023/0119987 A1 Apr. 20, 2023

Related U.S. Application Data

(60) Provisional application No. 63/255,656, filed on Oct. 14, 2021.

(51) Int. Cl.
*H03F 3/24* (2006.01)
*H04L 5/00* (2006.01)

(52) U.S. Cl.
CPC ............. *H03F 3/24* (2013.01); *H04L 5/0007* (2013.01)

(58) Field of Classification Search
CPC .............. H03F 2200/451; H03F 3/245; H03F 2200/102; H03F 1/0227; H03F 3/195; H03F 3/19; H03F 1/0222; H03F 1/0233; H03F 2200/105; H03F 3/24; H03F 3/189; H03F 3/68; H03F 3/211; H03F 3/21; H03F 1/3241; H03F 1/02; H03F 2200/336;
(Continued)

(56) References Cited

U.S. PATENT DOCUMENTS 5,982,233 A 11/1999 Hellmark et al.
7,859,338 B2 12/2010 Bajdechi et al.
(Continued)

FOREIGN PATENT DOCUMENTS

DE 102019218816 A1 6/2020
EP 2254237 A2 11/2010
(Continued)

OTHER PUBLICATIONS

U.S. Appl. No. 17/942,472, filed Sep. 12, 2022.
(Continued)

*Primary Examiner* — Golam Sorowar
(74) *Attorney, Agent, or Firm* — Withrow & Terranova, P.L.L.C.

(57) ABSTRACT

Circuit and method for intra-symbol voltage method are disclosed. In an embodiment, a transceiver circuit is configured to divide a voltage modulation interval(s) (e.g., a symbol duration) into multiple voltage modulation subintervals each corresponding to a respective one of multiple voltage targets. Accordingly, a power management integrated circuit (PMIC) can adapt a modulated voltage multiple times within the voltage modulation interval(s) based on multiple voltage targets, respectively. By adapting the modulated voltage within the voltage modulation interval(s), the modulated voltage can be timely adapted to closely track a time-variant power envelope of a radio frequency (RF) signal to thereby avoid potential distortion (e.g., amplitude clipping) during amplification of the RF signal.

19 Claims, 6 Drawing Sheets

(58) Field of Classification Search
CPC ............ H03F 1/0216; H03F 2200/375; H03F 2200/111; H04B 1/40; H04B 2001/0408; H04B 1/0475; H04B 1/04; H04B 2001/0425; H04B 2001/0441; H04B 1/16
See application file for complete search history.

(56) References Cited

U.S. PATENT DOCUMENTS

| | | |
|---|---|---|
| 8,159,309 B1 | 4/2012 | Khlat et al. |
| 8,718,188 B2 | 5/2014 | Balteanu et al. |
| 8,912,769 B2 | 12/2014 | Lin et al. |
| 9,020,453 B2 | 4/2015 | Briffa et al. |
| 9,069,365 B2 | 6/2015 | Brown et al. |
| 9,148,090 B2 | 9/2015 | Tsuji |
| 9,172,331 B2 | 10/2015 | Nagasaku et al. |
| 9,231,527 B2 | 1/2016 | Hur et al. |
| 9,252,724 B2 | 2/2016 | Wimpenny |
| 9,350,299 B2 | 5/2016 | Tsuj |
| 9,356,512 B2 | 5/2016 | Chowdhury et al. |
| 9,356,760 B2 | 5/2016 | Larsson et al. |
| 9,391,567 B2 | 7/2016 | Kacman |
| 9,407,476 B2 | 8/2016 | Lim et al. |
| 9,496,828 B2 | 11/2016 | Ye |
| 9,560,595 B2 | 1/2017 | Dakshinamurthy et al. |
| 9,590,563 B2 | 3/2017 | Wimpenny |
| 9,614,477 B1 | 4/2017 | Rozenblit et al. |
| 9,634,560 B2 | 4/2017 | Ek |
| 9,755,677 B2 | 9/2017 | Talty et al. |
| 9,991,913 B1 | 6/2018 | Dinur et al. |
| 10,097,145 B1 | 10/2018 | Khlat et al. |
| 10,103,926 B1 | 10/2018 | Khlat |
| 10,142,074 B2 | 11/2018 | Wang et al. |
| 10,243,524 B2 | 3/2019 | Orr |
| 10,326,408 B2 | 6/2019 | Khlat et al. |
| 10,476,437 B2 | 11/2019 | Nag et al. |
| 10,778,094 B2 | 9/2020 | de Cremoux |
| 10,862,428 B2 | 12/2020 | Henzler et al. |
| 10,998,859 B2 | 5/2021 | Khlat |
| 11,018,627 B2 | 5/2021 | Khlat |
| 11,018,638 B2 | 5/2021 | Khlat et al. |
| 11,088,660 B2 | 8/2021 | Lin et al. |
| 11,223,323 B2 | 1/2022 | Drogi et al. |
| 11,223,325 B2 | 1/2022 | Drogi et al. |
| 11,349,513 B2 | 5/2022 | Khlat et al. |
| 11,539,330 B2 | 12/2022 | Khlat |
| 11,569,783 B2 | 1/2023 | Nomiyama et al. |
| 11,588,449 B2 | 2/2023 | Khlat et al. |
| 11,665,654 B2 | 5/2023 | Park et al. |
| 11,716,057 B2 | 8/2023 | Khlat |
| 11,728,774 B2 | 8/2023 | Khlat |
| 11,757,414 B2 | 9/2023 | Drogi et al. |
| 11,894,767 B2 | 2/2024 | Khlat et al. |
| 11,909,385 B2 | 2/2024 | Khlat |
| 11,973,469 B2 | 4/2024 | Retz et al. |
| 11,984,853 B2 | 5/2024 | Khlat |
| 11,984,854 B2 | 5/2024 | Khlat et al. |
| 12,063,018 B2 | 8/2024 | Khlat |
| 2003/0099230 A1 | 5/2003 | Wenk |
| 2004/0179382 A1 | 9/2004 | Thaker et al. |
| 2011/0109393 A1 | 5/2011 | Adamski et al. |
| 2012/0068767 A1 | 3/2012 | Henshaw et al. |
| 2013/0141063 A1 | 6/2013 | Kay et al. |
| 2013/0141068 A1 | 6/2013 | Kay et al. |
| 2014/0055197 A1 | 2/2014 | Khlat et al. |
| 2014/0097895 A1 | 4/2014 | Khlat et al. |
| 2014/0232458 A1 | 8/2014 | Arno et al. |
| 2014/0312710 A1 | 10/2014 | Li |
| 2014/0315504 A1 | 10/2014 | Sakai et al. |
| 2014/0361837 A1 | 12/2014 | Strange et al. |
| 2015/0270806 A1 | 9/2015 | Wagh et al. |
| 2016/0094192 A1 | 3/2016 | Khesbak et al. |
| 2016/0241208 A1 | 8/2016 | Lehtola |
| 2016/0294587 A1 | 10/2016 | Jiang et al. |
| 2017/0331433 A1 | 11/2017 | Khlat |
| 2017/0373644 A1 | 12/2017 | Gatard et al. |
| 2018/0092047 A1 | 3/2018 | Merlin |
| 2018/0234011 A1 | 8/2018 | Muramatsu et al. |
| 2018/0257496 A1 | 9/2018 | Andoh et al. |
| 2018/0278213 A1 | 9/2018 | Henzler et al. |
| 2018/0351454 A1 | 12/2018 | Khesbak et al. |
| 2019/0068234 A1 | 2/2019 | Khlat et al. |
| 2019/0109566 A1 | 4/2019 | Folkmann et al. |
| 2019/0181813 A1 | 6/2019 | Maxim et al. |
| 2019/0222175 A1 | 7/2019 | Khlat et al. |
| 2019/0288645 A1 | 9/2019 | Nag et al. |
| 2019/0334750 A1 | 10/2019 | Nomiyama et al. |
| 2019/0356285 A1 | 11/2019 | Khlat et al. |
| 2020/0076297 A1 | 3/2020 | Nag et al. |
| 2020/0127612 A1 | 4/2020 | Khlat et al. |
| 2020/0136575 A1 | 4/2020 | Khlat et al. |
| 2020/0204422 A1 | 6/2020 | Khlat |
| 2020/0212796 A1 | 7/2020 | Murphy et al. |
| 2020/0228063 A1 | 7/2020 | Khlat |
| 2020/0266766 A1 | 8/2020 | Khlat et al. |
| 2020/0295708 A1 | 9/2020 | Khlat |
| 2020/0321917 A1* | 10/2020 | Nomiyama ............... H03F 3/21 |
| 2020/0336105 A1 | 10/2020 | Khlat |
| 2020/0336111 A1* | 10/2020 | Khlat .................... H03F 1/0211 |
| 2020/0382061 A1 | 12/2020 | Khlat |
| 2020/0382062 A1 | 12/2020 | Khlat |
| 2020/0389132 A1 | 12/2020 | Khlat et al. |
| 2021/0036604 A1 | 2/2021 | Khlat et al. |
| 2021/0099137 A1* | 4/2021 | Drogi ..................... H03F 3/195 |
| 2021/0126599 A1 | 4/2021 | Khlat et al. |
| 2021/0175798 A1 | 6/2021 | Liang |
| 2021/0184708 A1 | 6/2021 | Khlat |
| 2021/0194517 A1* | 6/2021 | Mirea ....................... H03F 3/24 |
| 2021/0218374 A1* | 7/2021 | Poulin ................ H04L 27/2601 |
| 2021/0226585 A1 | 7/2021 | Khlat |
| 2021/0257971 A1 | 8/2021 | Kim et al. |
| 2021/0265953 A1 | 8/2021 | Khlat |
| 2021/0288615 A1 | 9/2021 | Khlat |
| 2021/0389789 A1 | 12/2021 | Khlat et al. |
| 2021/0391833 A1 | 12/2021 | Khlat et al. |
| 2022/0021302 A1 | 1/2022 | Khlat et al. |
| 2022/0029614 A1 | 1/2022 | Khlat |
| 2022/0037982 A1 | 2/2022 | Khlat et al. |
| 2022/0052655 A1 | 2/2022 | Khalt |
| 2022/0057820 A1 | 2/2022 | Khlat et al. |
| 2022/0066487 A1 | 3/2022 | Khlat |
| 2022/0069788 A1 | 3/2022 | King et al. |
| 2022/0123744 A1 | 4/2022 | Khlat |
| 2022/0200447 A1 | 6/2022 | Khlat |
| 2022/0224364 A1 | 7/2022 | Kim et al. |
| 2022/0271714 A1 | 8/2022 | Khlat |
| 2022/0294486 A1* | 9/2022 | Cao ........................ H03F 1/025 |
| 2022/0407465 A1* | 12/2022 | Khlat ..................... H03F 3/245 |
| 2023/0081095 A1 | 3/2023 | Khlat |
| 2023/0085587 A1* | 3/2023 | Shute ..................... H03F 3/213 |
| | | 330/127 |
| 2023/0118768 A1 | 4/2023 | Khlat |
| 2023/0124652 A1 | 4/2023 | Khlat et al. |
| 2023/0124941 A1 | 4/2023 | Khlat |
| 2024/0172131 A1* | 5/2024 | Ballantyne ............ H04L 5/0048 |
| 2024/0223129 A1 | 7/2024 | Retz et al. |

FOREIGN PATENT DOCUMENTS

| | | |
|---|---|---|
| WO | 2018187245 A1 | 10/2018 |
| WO | 2021016350 A1 | 1/2021 |

OTHER PUBLICATIONS

U.S. Appl. No. 17/946,170, filed Sep. 16, 2022.
U.S. Appl. No. 17/946,224, filed Sep. 16, 2022.
U.S. Appl. No. 17/947,567, filed Sep. 19, 2022.
Notice of Allowance for U.S. Appl. No. 17/316,828, mailed Sep. 13, 2023, 8 pages.
Final Office Action for U.S. Appl. No. 17/942,472, mailed Jul. 19, 2023, 15 pages.
Advisory Action Action for U.S. Appl. No. 17/942,472, mailed Sep. 15, 2023, 3 pages.

(56) References Cited

OTHER PUBLICATIONS

International Preliminary Report on Patentability for International Patent Application No. PCT/US2021/061721, mailed Apr. 4, 2023, 21 pages.
Notice of Allowance for U.S. Appl. No. 17/325,482, mailed Nov. 30, 2022, 8 pages.
Final Office Action for U.S. Appl. No. 17/408,899, mailed Dec. 27, 2022, 13 pages.
Non-Final Office Action for U.S. Appl. No. 17/217,654, mailed Jul. 1, 2022, 9 pages.
Non-Final Office Action for U.S. Appl. No. 17/218,904, mailed May 25, 2022, 14 pages.
Notice of Allowance for U.S. Appl. No. 17/315,652, mailed Jun. 20, 2022, 8 pages.
Mellon, L., "Data Transmission—Parallel vs Serial," Jul. 10, 2017, https://www.quantil.com/content-delivery-insights/content-acceleration/data-transmission/, 4 pages.
International Search Report and Written Opinion for International Patent Application No. PCT/US2021/044596, mailed Apr. 21, 2022, 13 pages.
Written Opinion for International Patent Application No. PCT/US2021/044596, mailed Jun. 10, 2022, 6 pages.
International Preliminary Report on Patentability for International Patent Application No. PCT/US2021/044596, mailed Sep. 1, 2022, 19 pages.
Notice of Allowance for U.S. Appl. No. 17/182,539, mailed Sep. 14, 2022, 7 pages.
Notice of Allowance for U.S. Appl. No. 17/217,654, mailed Oct. 12, 2022, 8 pages.
Non-Final Office Action for U.S. Appl. No. 17/237,244, mailed Sep. 20, 2021, 14 pages.
Notice of Allowance for U.S. Appl. No. 17/237,244, mailed Jan. 27, 2022, 8 pages.
Notice of Allowance for U.S. Appl. No. 17/218,904, mailed Aug. 26, 2022, 9 pages.
Non-Final Office Action for U.S. Appl. No. 17/325,482, mailed Sep. 30, 2021, 10 pages.
Non-Final Office Action for U.S. Appl. No. 17/325,482, mailed Mar. 15, 2022, 10 pages.
Final Office Action for U.S. Appl. No. 17/325,482, mailed Aug. 16, 2022, 12 pages.
Advisory Action for U.S. Appl. No. 17/325,482, mailed Oct. 14, 2022, 3 pages.
Non-Final Office Action for U.S. Appl. No. 17/315,652, mailed Sep. 2, 2021, 7 pages.
Non-Final Office Action for U.S. Appl. No. 17/315,652, mailed Feb. 14, 2022, 12 pages.
Non-Final Office Action for U.S. Appl. No. 17/408,899, mailed Aug. 29, 2022, 13 pages.
International Search Report and Written Opinion for International Patent Application No. PCT/US2021/061721, mailed Mar. 14, 2022, 13 pages.
Written Opinion for International Patent Application No. PCT/US2021/061721, mailed Sep. 9, 2022, 7 pages.
Paek, J.S. et al., "15.2 A 90ns/V Fast-Transition Symbol-Power-Tracking Buck Converter for 5G mm-Wave Phased-Array Transceiver," 2019 IEEE International Solid-State Circuits Conference, Feb. 2019, San Francisco, CA, USA, IEEE, 3 pages.
Notice of Allowance for U.S. Appl. No. 17/217,594, mailed Apr. 3, 2023, 7 pages.
Notice of Allowance for U.S. Appl. No. 17/408,899, mailed Feb. 24, 2023, 9 pages.
Non-Final Office Action for U.S. Appl. No. 17/942,472, mailed Feb. 16, 2023, 13 pages.
Extended European Search Report for European Patent Application No. 22195683.2, mailed Feb. 10, 2023, 12 pages.
Written Opinion for International Patent Application No. PCT/US2021/061721, mailed Mar. 1, 2023, 7 pages.
Extended European Search Report for European Patent Application No. 22200302.2, mailed Mar. 1, 2023, 14 pages.
Extended European Search Report for European Patent Application No. 22200322.0, mailed Mar. 1, 2023, 13 pages.
Extended European Search Report for European Patent Application No. 22200300.6, mailed Feb. 24, 2023, 10 pages.
Extended European Search Report for European Patent Application No. 22200111.7, mailed Feb. 20, 2023, 9 pages.
Notice of Allowance for U.S. Appl. No. 17/942,472, mailed Oct. 18, 2023, 10 pages.
Corrected Notice of Allowability for U.S. Appl. No. 17/942,472, mailed Nov. 17, 2023, 5 pages.
Non-Final Office Action for U.S. Appl. No. 18/203,197, mailed Sep. 16, 2024, 6 pages.
Notice of Allowance for U.S. Appl. No. 17/947,567, mailed Oct. 23, 2024, 11 pages.

* cited by examiner

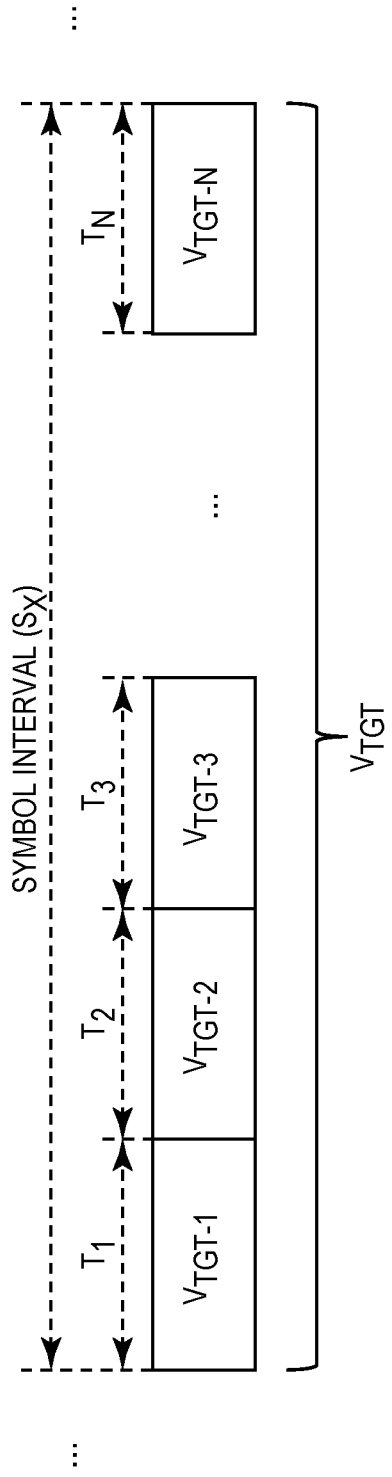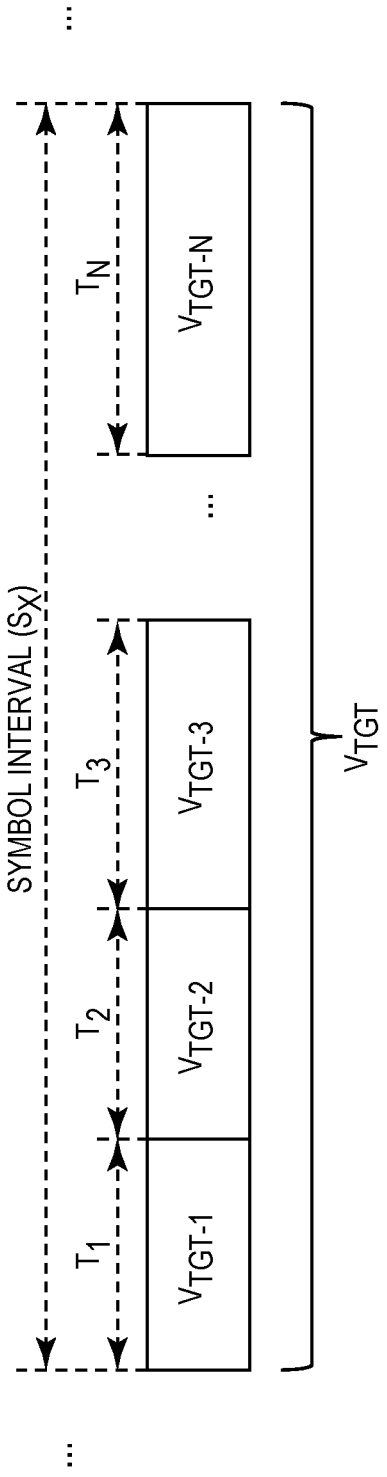

RECEIVE A PLURALITY OF TARGET VOLTAGE INDICATIONS ($V_{TGT}(i)$) EACH CORRESPONDING TO A RESPECTIVE ONE OF A PLURALITY OF VOLTAGE MODULATION INTERVALS ($S_{x-1}, S_x, S_{x+1}$) AND COMPRISING A PLURALITY OF VOLTAGE TARGETS ($V_{TGT-1}$-$V_{TGT-N}$) EACH CORRESPONDING TO A RESPECTIVE ONE OF A PLURALITY OF VOLTAGE MODULATION SUBINTERVALS ($T_1$-$T_N$) WITHIN THE RESPECTIVE ONE OF THE PLURALITY OF VOLTAGE MODULATION INTERVALS ($S_{x-1}, S_x, S_{x+1}$)
202

GENERATE A PLURALITY OF MODULATED VOLTAGES ($V_{CC1}$-$V_{CCN}$) IN THE PLURALITY OF VOLTAGE MODULATION SUBINTERVALS ($T_1$-$T_N$) BASED ON THE PLURALITY OF VOLTAGE TARGETS ($V_{TGT-1}$-$V_{TGT-N}$), RESPECTIVELY
204

*FIG. 6*

CIRCUIT AND METHOD FOR INTRA-SYMBOL VOLTAGE MODULATION

RELATED APPLICATIONS

This application claims the benefit of U.S. provisional patent application Ser. No. 63/255,656 filed on Oct. 14, 2021, the disclosure of which is incorporated herein by reference in its entirety.

FIELD OF THE DISCLOSURE

The technology of the disclosure relates generally to intra-symbol voltage modulation.

BACKGROUND

Fifth generation (5G) new radio (NR) (5G-NR) has been widely regarded as the next generation of wireless communication technology beyond the current third generation (3G) and fourth generation (4G) technologies. In this regard, a wireless communication device capable of supporting the 5G-NR wireless communication technology is expected to achieve higher data rates, improved coverage range, enhanced signaling efficiency, and reduced latency.

Downlink and uplink transmissions in a 5G-NR system are widely based on orthogonal frequency division multiplexing (OFDM) technology. In an OFDM based system, physical radio resources are divided into a number of subcarriers in a frequency domain and a number of OFDM symbols in a time domain. The subcarriers are orthogonally separated from each other by a subcarrier spacing (SCS). The OFDM symbols are separated from each other by a cyclic prefix (CP), which acts as a guard band to help overcome inter-symbol interference (ISI) between the OFDM symbols.

A radio frequency (RF) signal communicated in the OFDM based system is often modulated into multiple subcarriers in the frequency domain and multiple OFDM symbols in the time domain. The multiple subcarriers occupied by the RF signal collectively define a modulation bandwidth of the RF signal. The multiple OFDM symbols, on the other hand, define multiple time intervals during which the RF signal is communicated. In the 5G-NR system, the RF signal is typically modulated with a high modulation bandwidth in excess of 200 MHz.

The duration of an OFDM symbol depends on the SCS and the modulation bandwidth. The table below (Table 1) provides some OFDM symbol durations, as defined by 3G partnership project (3GPP) standards for various SCSs and modulation bandwidths. Notably, the higher the modulation bandwidth is, the shorter the OFDM symbol duration will be. For example, when the SCS is 120 KHz and the modulation bandwidth is 400 MHz, the OFDM symbol duration is 8.93 µs.

TABLE 1

| SCS (KHz) | CP (µs) | OFDM Symbol Duration (µs) | Modulation Bandwidth (MHz) |
|---|---|---|---|
| 15 | 4.69 | 71.43 | 50 |
| 30 | 2.34 | 35.71 | 100 |
| 60 | 1.17 | 17.86 | 200 |
| 120 | 0.59 | 8.93 | 400 |

In a 5G-NR system, the RF signal can be modulated with a time-variant power that changes from one OFDM symbol to another. In this regard, a power amplifier circuit(s) is required to amplify the RF signal to a certain power level within each OFDM symbol duration. Such inter-symbol power variation creates a unique challenge for a power management integrated circuit (PMIC) because the PMIC must be able to adapt a modulated voltage supplied to the power amplifier circuit within the CP of each OFDM symbol to help avoid distortion (e.g., amplitude clipping) in the RF signal.

SUMMARY

Embodiments of the disclosure relate to a circuit and method for intra-symbol voltage modulation. In an embodiment, a transceiver circuit is configured to divide a voltage modulation interval(s) (e.g., a symbol duration) into multiple voltage modulation subintervals each corresponding to a respective one of multiple voltage targets. Accordingly, a power management integrated circuit (PMIC) can adapt a modulated voltage multiple times within the voltage modulation interval(s) based on multiple voltage targets, respectively. By adapting the modulated voltage within the voltage modulation interval(s), the modulated voltage can be timely adapted to closely track a time-variant power envelope of a radio frequency (RF) signal to thereby avoid potential distortion (e.g., amplitude clipping) during amplification of the RF signal.

In one aspect, a PMIC is provided. The PMIC includes a voltage generation circuit. The voltage generation circuit is configured to receive multiple target voltage indications each corresponding to a respective one of multiple voltage modulation intervals and comprising multiple voltage targets each corresponding to a respective one of multiple voltage modulation subintervals within the respective one of the multiple voltage modulation intervals. The voltage generation circuit is also configured to generate multiple modulated voltages in the multiple voltage modulation subintervals based on the multiple voltage targets, respectively.

In another aspect, a transmission circuit is provided. The transmission circuit includes a PMIC. The PMIC includes a voltage generation circuit. The voltage generation circuit is configured to receive multiple target voltage indications each corresponding to a respective one of multiple voltage modulation intervals and comprising multiple voltage targets each corresponding to a respective one of multiple voltage modulation subintervals within the respective one of the multiple voltage modulation intervals. The voltage generation circuit is also configured to generate multiple modulated voltages in the multiple voltage modulation subintervals based on the multiple voltage targets, respectively. The transmission circuit also includes a transceiver circuit. The transceiver circuit is coupled to the PMIC and configured to generate and provide the multiple target voltage indications to the PMIC.

In another aspect, a method for enabling intra-symbol voltage modulation is provided. The method includes receiving multiple target voltage indications each corresponding to a respective one of multiple voltage modulation intervals and comprising multiple voltage targets each corresponding to a respective one of multiple voltage modulation subintervals within the respective one of the multiple voltage modulation intervals. The method also includes generating multiple modulated voltages in the multiple voltage modulation subintervals based on the multiple voltage targets, respectively.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 3A and 3B are block diagrams providing exemplary illustrations of the voltage modulation interval(s) in FIG. 2;

FIG. 6 is a flowchart of an exemplary process for enabling intra-symbol voltage modulation according to embodiments of the present disclosure.

DETAILED DESCRIPTION

Figure 1:
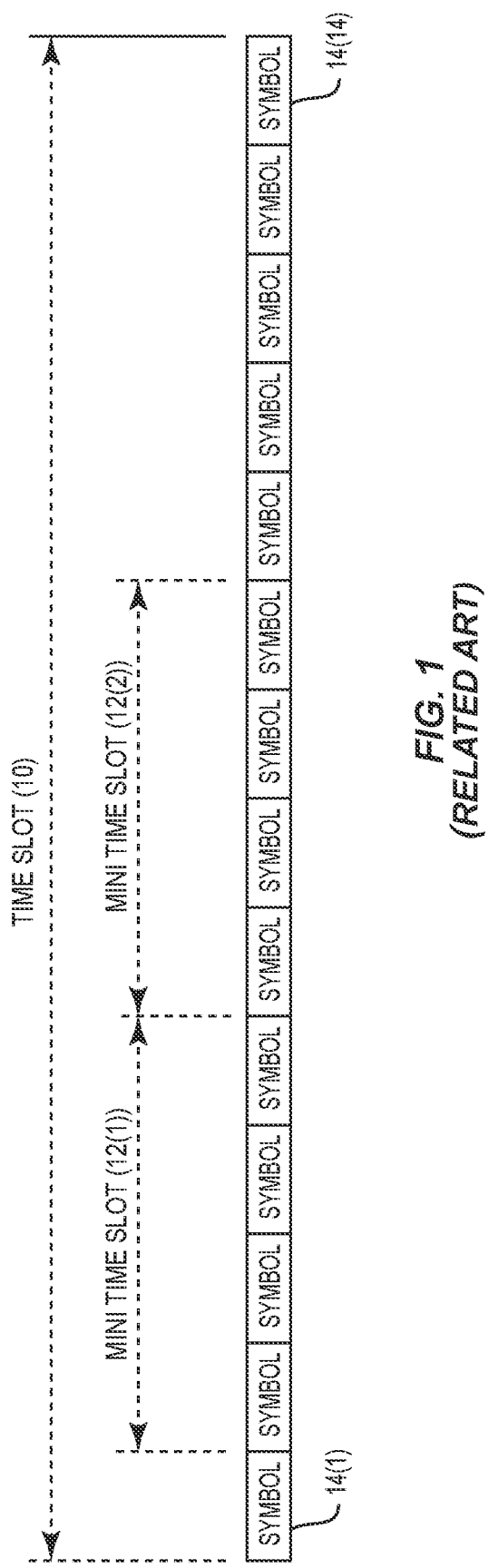
FIG. 1 illustrates an exemplary time slot(s) and a mini time slot(s) as widely supported in a fifth generation (5G) or a 5G new-radio (5G-NR) system.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to circuit and method for intra-symbol voltage modulation. In an embodiment, a transceiver circuit is configured to divide a voltage modulation interval(s) (e.g., a symbol duration) into multiple voltage modulation subintervals each corresponding to a respective one of multiple voltage targets. Accordingly, a power management integrated circuit (PMIC) can adapt a modulated voltage multiple times within the voltage modulation interval(s) based on multiple voltage targets, respectively. By adapting the modulated voltage within the voltage modulation interval(s), the modulated voltage can be timely adapted to closely track a time-variant power envelope of a radio frequency (RF) signal to thereby avoid potential distortion (e.g., amplitude clipping) during amplification of the RF signal.

Figure 2:
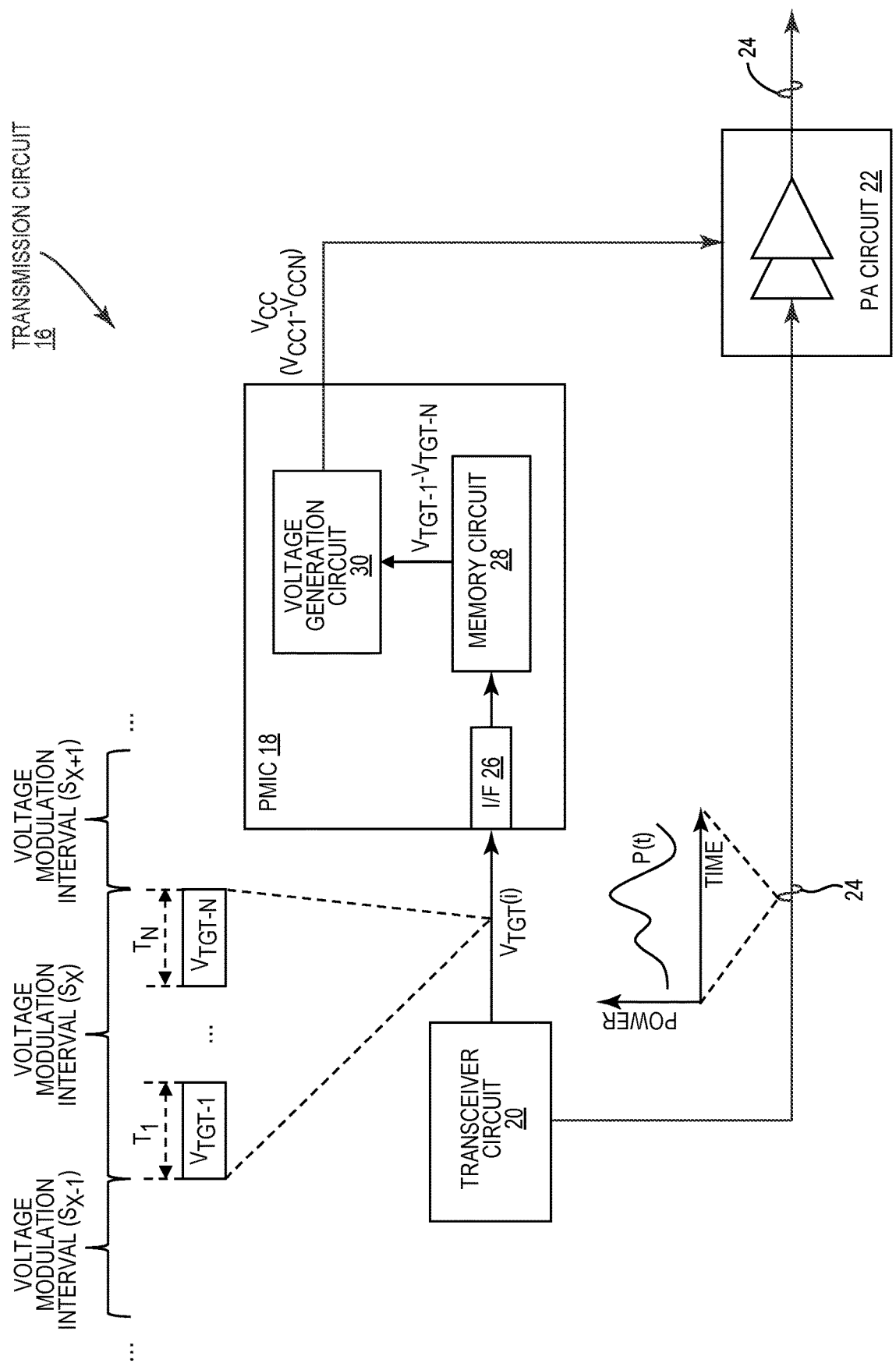
FIG. 2 is a schematic diagram of an exemplary transmission circuit wherein a power management integrated circuit (PMIC) and a transceiver circuit are configured according to embodiments of the present disclosure to enable intra-symbol voltage modulation during a voltage modulation interval(s)

Before discussing intra-symbol voltage modulation according to the present disclosure, starting at FIG. 2, an overview of orthogonal frequency division multiplexing (OFDM) symbols, which can be used to define durations of voltage modulation intervals, is first provided with reference to FIG. 1.

FIG. 1 illustrates an exemplary time slot 10 and a pair of mini time slots 12(1)-12(2) as widely supported in a fifth generation (5G) and 5G new-generation (5G-NR) system. The time slot(s) 10 is configured to include multiple symbols 14(1)-14(14), such as OFDM symbols. The mini time slots 12(1)-12(2) can each include at least two of the symbols 14(1)-14(14). In the example shown in FIG. 1, each of the mini time slots 12(1)-12(2) includes four of the symbols 14(1)-14(14).

As previously shown in Table 1, each of the symbols 14(1)-14(14) has a symbol duration that depends on the subcarrier spacing (SCS). In this regard, once the SCS is chosen, the duration and the CP of each of the symbols 14(1)-14(14) are set accordingly. Hereinafter, the duration of the symbols 14(1)-14(14) is used to define the duration of a voltage modulation interval.

FIG. 2 is a schematic diagram of an exemplary transmission circuit 16 wherein a PMIC 18 and a transceiver circuit 20 are configured according to embodiments of the present disclosure to enable intra-symbol voltage modulation during each of multiple voltage modulation intervals $S_{X-1}$, $S_X$, $S_{X+1}$. Herein, the voltage modulation intervals $S_{X-1}$, $S_X$, $S_{X+1}$ represent three consecutive voltage modulation intervals among any number of voltage modulation intervals, so chosen for the sole purpose of illustration. Understandably, the voltage modulation interval $S_{X-1}$ is an immediately preceding voltage modulation interval of the voltage modulation interval $S_X$, the voltage modulation interval $S_X$ is an immediately preceding voltage modulation interval of the voltage modulation interval $S_{X+1}$, and so on.

The transmission circuit 16 further includes a power amplifier circuit 22. The power amplifier circuit 22 is configured to amplify an RF signal 24 based on a modulated voltage $V_{CC}$, which can be an envelope tracking (ET) modulated voltage or an average power tracking (APT) modulated voltage. Herein, the transceiver circuit 20 is configured to generate the RF signal 24 and the PMIC 18 is configured to generate the modulated voltage $V_{CC}$.

Herein, the transceiver circuit 20 is configured to generate the RF signal 24 with a time-variant power envelope P(t) that can increase or decrease multiple times during each of the symbols 14(1)-14(14) in FIG. 1. As such, the PMIC 18 is configured to adapt the modulated voltage $V_{CC}$ multiple times to thereby generate multiple modulated voltages $V_{CC1}$-$V_{CCN}$ during each of the voltage modulation intervals $S_{X-1}$, $S_X$, $S_{X+1}$. As such, the modulated voltages $V_{CC1}$-$V_{CCN}$ can better track (increase or decrease) the time-variant power envelope P(t) on an intra-symbol basis to help avoid potential distortion (e.g., amplitude clipping) to the RF signal 24 when the RF signal 24 is amplified by the power amplifier circuit 22.

According to an embodiment of the present disclosure, the PMIC 18 includes an inter-chip interface 26, a memory circuit 28, and a voltage generation circuit 30. In a non-limiting example, the inter-chip interface 26 can be a multi-wire interface, such as an RF front-end (RFFE) interface, that is coupled to the transceiver circuit 20. The transceiver circuit 20 is configured to provide a respective target voltage indication $V_{TGT}(i)$ (i=X−1, X, X+1, and so on) for each of the voltage modulation intervals $S_{X-1}$, $S_X$, $S_{X+1}$. Each target voltage indication $V_{TGT}(i)$ is divided into multiple voltage modulation subintervals $T_1$-$T_N$ and each of the modulation subintervals $T_1$-$T_N$ is associated with a respective one of multiple voltage targets $V_{TGT-1}$-$V_{TGT-N}$.

The transceiver circuit 20 is configured to divide each of the voltage modulation intervals $S_{X-1}$, $S_X$, $S_{X+1}$ into the modulation subintervals $T_1$-$T_N$. In this regard, FIGS. 3A and 3B are block diagrams providing exemplary illustrations of the voltage modulation intervals $S_{X-1}$, $S_X$, $S_{X+1}$. Common elements between FIGS. 2 and 3A-3B are shown therein with common element numbers and will not be re-described herein.

In one embodiment, as illustrated in FIG. 3A, the transceiver circuit 20 can divide each of the voltage modulation intervals $S_{X-1}$, $S_X$, $S_{X+1}$ equally. As such, each of the modulation subintervals $T_1$-$T_N$ will have an identical duration.

In another embodiment, as illustrated in FIG. 3B, the transceiver circuit 20 can divide each of the voltage modulation intervals $S_{X-1}$, $S_X$, $S_{X+1}$ unequally such that each of the modulation subintervals $T_1$-$T_N$ will have different durations. For example, the transceiver circuit 20 can make any of the modulation subintervals $T_1$-$T_N$ longer if a variation of the modulated voltage $V_{CC}$ exceeds a preset threshold between adjacent ones of the modulation subintervals $T_1$-$T_N$, or make any of the modulation subintervals $T_1$-$T_N$ shorter if the modulated voltage $V_{CC}$ remains unchanged or the variation of the modulated voltage $V_{CC}$ is below the preset threshold in between the adjacent ones of the modulation subintervals $T_1$-$T_N$.

In another embodiment, the transceiver circuit 20 can also divide some of the voltage modulation intervals $S_{X-1}$, $S_X$, $S_{X+1}$ into the modulation subintervals $T_1$-$T_N$ with an equal duration, while dividing some other voltage modulation intervals $S_{X-1}$, $S_X$, $S_{X+1}$ into the modulation subintervals $T_1$-$T_N$ with unequal durations. For example, the transceiver circuit 20 can equally divide the voltage modulation interval $S_{X-1}$ into the modulation subintervals $T_1$-$T_N$ with an equal duration and divide each of the voltage modulation intervals $S_X$ and $S_{X+1}$ into the modulation subintervals $T_1$-$T_N$ with unequal durations.

With reference back to FIG. 2, the transceiver circuit 20 is also configured to set the voltage targets $V_{TGT-1}$-$V_{TGT-N}$ for each of the modulation subintervals $T_1$-$T_N$ based on the time-variant power envelope P(t) of the RF signal 24. In a non-limiting example, the transceiver circuit 20 can set a respective one of the voltage targets $V_{TGT-1}$-$V_{TGT-N}$ for a respective one of the modulation subintervals $T_1$-$T_N$ based on a maximum of the time-variant power envelope P(t) during the respective one of the modulation subintervals $T_1$-$T_N$.

The transceiver circuit 20 is configured to write the voltage targets $V_{TGT-1}$-$V_{TGT-N}$, in association with the modulation subintervals $T_1$-$T_N$, into the memory circuit 28 via the inter-chip interface 26. In one embodiment, the transceiver circuit 20 may write the voltage targets $V_{TGT-1}$-$V_{TGT-N}$ associated with any of the voltage modulation intervals $S_{X-1}$, $S_X$, $S_{X+1}$ prior to a start of the respective voltage modulation interval. For example, the transceiver circuit 20 may write the voltage targets $V_{TGT-1}$-$V_{TGT-N}$ associated with the voltage modulation interval $S_{X+1}$ during the voltage modulation interval $S_{X-1}$ or the voltage modulation interval $S_X$. Preferably, the transceiver circuit 20 will write the voltage targets $V_{TGT-1}$-$V_{TGT-N}$ associated with any of the voltage modulation intervals $S_{X-1}$, $S_X$, $S_{X+1}$ during an immediately preceding one of the voltage modulation intervals $S_{X-1}$, $S_X$, $S_{X+1}$. For example, the transceiver circuit 20 will write the voltage targets $V_{TGT-1}$-$V_{TGT-N}$ associated with the voltage modulation interval $S_X$ during the voltage modulation interval $S_{X-1}$ and write the voltage targets $V_{TGT-1}$-$V_{TGT-N}$ associated with the voltage modulation interval $S_{X+1}$ during the voltage modulation interval $S_X$.

Prior to each of the voltage modulation intervals $S_{X-1}$, $S_X$, $S_{X+1}$, the voltage generation circuit 30 retrieves the voltage targets $V_{TGT-1}$-$V_{TGT-N}$, in association with the modulation subintervals $T_1$-$T_N$, from the memory circuit 28. Accordingly, the voltage generation circuit 30 can generate the modulated voltages $V_{CC-1}$-$V_{CC-N}$ during the modulation subintervals $T_1$-$T_N$ based on the voltage targets $V_{TGT-1}$-$V_{TGT-N}$, respectively.

Figure 4:
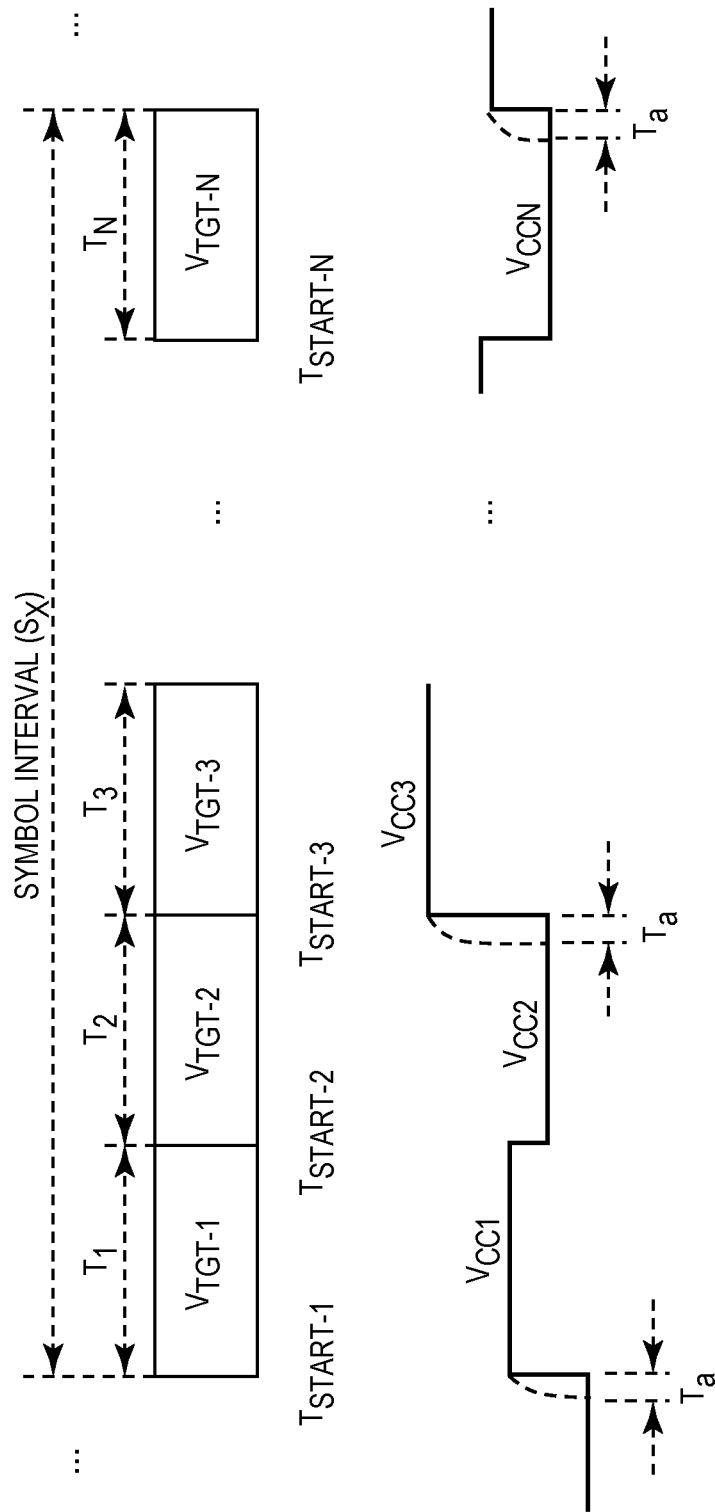
FIG. 4 is a block diagram providing an exemplary illustration as to how the PMIC in FIG. 2 can perform intra-symbol voltage modulation during the voltage modulation interval(s)

FIG. 4 is a block diagram providing an exemplary illustration as to how the PMIC 18 in FIG. 2 can perform intra-symbol voltage modulation during each of the voltage modulation intervals $S_{X-1}$, $S_X$, $S_{X+1}$. Common elements between FIGS. 2 and 4 are shown therein with common element numbers and will not be re-described herein.

The voltage generation circuit 30 is configured to determine multiple starts $T_{START-1}$-$T_{START-N}$ of the modulation subintervals $T_1$-$T_N$, respectively. In a non-limiting example, the voltage generation circuit 30 can receive the start $T_{START-1}$-$T_{START-N}$ of the modulation subintervals $T_1$-$T_N$ from the transceiver circuit 20 together with or separately from the voltage targets $V_{TGT-1}$-$V_{TGT-N}$. Accordingly, the voltage generation circuit 30 can generate each of the modulated voltages $V_{CC-1}$-$V_{CC-N}$ no later than a respective one of the determined start $T_{START-1}$-$T_{START-N}$ of the voltage modulation subintervals $T_1$-$T_N$.

According to an embodiment of the present disclosure, the voltage generation circuit 30 is configured to determine whether each of the modulated voltages $V_{CC-1}$-$V_{CC-N}$ is set to increase or decrease during a respective one of the modulation subintervals $T_1$-$T_N$. If any of the modulated voltages $V_{CC-1}$-$V_{CC-N}$ is set to increase during the respective one of the modulation subintervals $T_1$-$T_N$, the voltage generation circuit 30 may start transitioning to the respective one the modulated voltages $V_{CC-1}$-$V_{CC-N}$ prior to the respective start $T_{START-1}$-$T_{START-N}$ of the respective one of the modulation subintervals $T_1$-$T_N$. For example, the voltage generation circuit 30 determines that the modulated voltages $V_{CC-1}$ and $V_{CC-3}$ are set to increase during the modulation subintervals $T_1$ and $T_3$, respectively. Accordingly, the voltage generation circuit 30 will start transitioning to the modulated voltages $V_{CC-1}$ and $V_{CC-3}$ with a timing advance $T_a$ prior to the respective starts $T_{START-1}$ and $T_{START-3}$ of the modulation subintervals $T_1$ and $T_3$. By starting the transition with the timing advance $T_a$, the voltage generation circuit 30 can ensure that the modulated voltages $V_{CC-1}$ and $V_{CC-3}$ can be ramped up to desired levels in time to help avoid amplitude clipping in the RF signal 24.

In contrast, if any of the modulated voltages $V_{CC-1}$-$V_{CC-N}$ is set to decrease, or remain unchanged, during the respective one of the modulation subintervals $T_1$-$T_N$, the voltage generation circuit 30 may start transitioning to the respective one the modulated voltages $V_{CC-1}$-$V_{CC-N}$ at the respective start $T_{START-1}$-$T_{START-N}$ of the respective one of the modulation subintervals $T_1$-$T_N$. For example, the voltage generation circuit 30 determines that the modulated voltages $V_{CC-2}$ and $V_{CC-N}$ are set to decrease during the modulation subintervals $T_2$ and $T_N$, respectively. Accordingly, the voltage generation circuit 30 will start transitioning to the modulated voltages $V_{CC-2}$ and $V_{CC-N}$ right at the respective starts $T_{START-2}$ and $T_{START-N}$ of the modulation subintervals $T_2$ and $T_N$.

Figure 5:
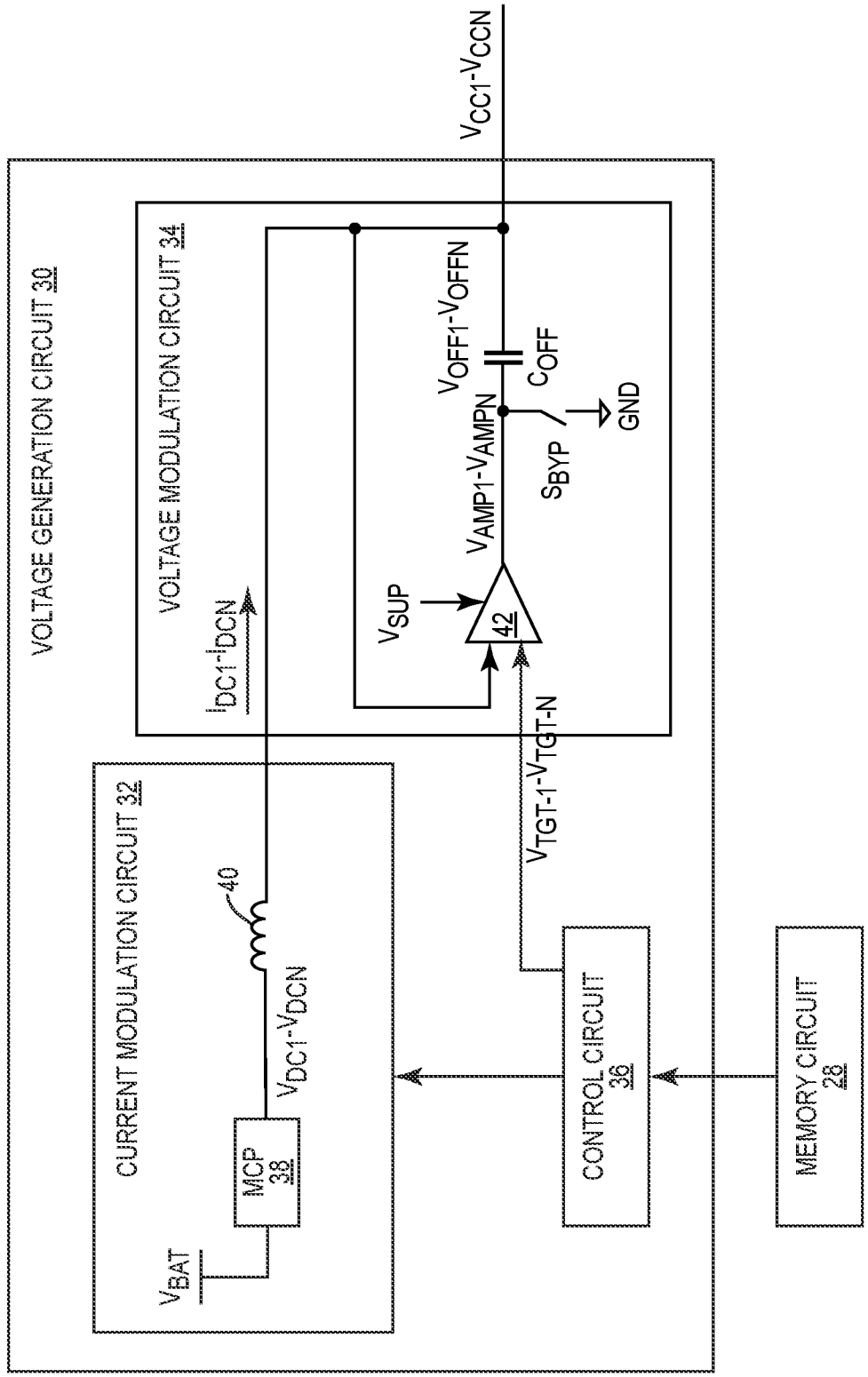
FIG. 5 is a schematic diagram of an exemplary voltage modulation circuit, which can be provided in the PMIC in FIG. 2 to perform intra-symbol voltage modulation during the voltage modulation interval(s)

FIG. 5 is a schematic diagram of the voltage generation circuit 30 configured according to an embodiment of the present disclosure. Common elements between FIGS. 2 and 5 are shown therein with common element numbers and will not be re-described herein.

Herein, the voltage generation circuit 30 includes a current modulation circuit 32, a voltage modulation circuit 34, and a control circuit 36. The current modulation circuit 32 includes a multi-level charge pump (MCP) 38 and a power inductor 40. During each of the voltage modulation intervals $S_{X-1}$, $S_X$, $S_{X+1}$, the MCP 38 is configured to generate multiple low-frequency voltages $V_{DC-1}$-$V_{DCN}$, each as a function of a battery voltage $V_{BAT}$, during the modulation subintervals $T_1$-$T_N$, respectively. Accordingly, in each of the voltage modulation intervals $S_{X-1}$, $S_X$, $S_{X+1}$, the power inductor 40 is configured to induce multiple low frequency currents $I_{DC1}$-$I_{DCN}$ based on the low-frequency voltages $V_{DC-1}$-$V_{DCN}$, respectively.

The voltage modulation circuit 34 includes a voltage amplifier 42, an offset capacitor $C_{OFF}$, and a bypass switch $S_{BYP}$. The voltage amplifier 42 is configured to generate multiple modulated initial voltages $V_{AMP1}$-$V_{AMPN}$ based on the voltage targets $V_{TGT-1}$-$V_{TGT-N}$ in the modulation subintervals $T_1$-$T_N$, respectively. The offset capacitor $C_{OFF}$ is modulated by the low frequency currents $I_{DC1}$-$I_{DCN}$ to multiple offset voltages $V_{OFF1}$-$V_{OFFN}$ in the modulation subintervals $T_1$-$T_N$, respectively. Each of the offset voltages $V_{OFF1}$-$V_{OFFN}$ will raise a respective one of the modulated initial voltages $V_{AMP1}$-$V_{AMPN}$ to a respective one of the modulated voltages $V_{CC1}$-$V_{CCN}$. For a specific example as to how the offset voltages $V_{OFF1}$-$V_{OFFN}$ can be modulated by the low frequency currents $I_{DC1}$-$I_{DCN}$ to raise the modulated initial voltages $V_{AMP1}$-$V_{AMPN}$ to the modulated voltages $V_{CC1}$-$V_{CCN}$, please refer to U.S. patent application Ser. No. 17/946,224, entitled "MULTI-VOLTAGE GENERATION CIRCUIT."

The transmission circuit 16 of FIG. 2 can be configured to enable intra-symbol voltage modulation based on a process. In this regard, FIG. 6 is a flowchart of an exemplary process 200 for enabling intra-symbol voltage modulation according to embodiments of the present disclosure.

Herein, the PMIC 18 receives the target voltage indications $V_{TGT}(i)$ each corresponding to a respective one of the voltage modulation intervals $S_{X-1}$, $S_X$, $S_{X+1}$ and comprising the voltage targets $V_{TGT-1}$-$V_{TGT-N}$ each corresponding to a respective one of the voltage modulation subintervals $T_1$-$T_N$ within the respective one of the voltage modulation intervals $S_{X-1}$, $S_X$, $S_{X+1}$ (step 202). Accordingly, the PMIC 18 generates the modulated voltages $V_{CC1}$-$V_{CCN}$ in the voltage modulation subintervals $T_1$-$T_N$ based on the voltage targets $V_{TGT-1}$-$V_{TGT-N}$, respectively (step 204).

Those skilled in the art will recognize improvements and modifications to the preferred embodiments of the present disclosure. All such improvements and modifications are considered within the scope of the concepts disclosed herein and the claims that follow.

What is claimed is:

1. A power management integrated circuit (PMIC) comprising:
   a voltage generation circuit configured to:
   receive a plurality of target voltage indications each corresponding to a respective one of a plurality of voltage modulation intervals, wherein:
   each of the plurality of voltage modulation intervals has a duration of an orthogonal frequency division multiplexing (OFDM) symbol and is divided into a plurality of voltage modulation subintervals each shorter than the duration of the OFDM symbol; and
   each of the plurality of target voltage indications comprises a plurality of voltage targets each setting a voltage target for a respective one of the plurality of voltage modulation subintervals within the respective one of the plurality of voltage modulation intervals; and generate a plurality of modulated voltages in the plurality of voltage modulation subintervals based on the voltage target set in the plurality of voltage targets, respectively.

2. The PMIC of claim 1, further comprising:
an inter-chip interface coupled to a transceiver circuit to receive each of the plurality of target voltage indications prior to the respective one of the plurality of voltage modulation intervals; and
a memory circuit configured to store the plurality of received target voltage indications.

3. The PMIC of claim 2, wherein the inter-chip interface receives a corresponding one of the plurality of target voltage indications for the respective one of the of the plurality of voltage modulation intervals during one of the plurality of voltage modulation intervals immediately preceding the respective one of the plurality of voltage modulation intervals.

4. The PMIC of claim 1, wherein the voltage generation circuit is further configured to generate each of the plurality of modulated voltages for the respective one of the plurality of voltage modulation subintervals based on the respective one of the plurality of voltage targets no later than a respective start of the respective one of the plurality of voltage modulation subintervals.

5. The PMIC of claim 4, wherein the voltage generation circuit is further configured to:
generate a respective one of the plurality of modulated voltages prior to the respective start of the respective one of the plurality of voltage modulation subintervals in response to the respective one of the plurality of voltage targets indicating that the respective one of the plurality of modulated voltages will increase during the respective one of the plurality of voltage modulation subintervals; and
generate the respective one of the plurality of modulated voltages at the respective start of the respective one of the plurality of voltage modulation subintervals in response to the respective one of the plurality of voltage targets indicating that the respective one of the plurality of modulated voltages will decrease during the respective one of the plurality of voltage modulation subintervals.

6. The PMIC of claim 4, wherein each of the plurality of voltage modulation subintervals has an equal temporal duration.

7. The PMIC of claim 4, wherein each of the plurality of voltage modulation subintervals has an unequal temporal duration.

8. A transmission circuit comprising:
a power management integrated circuit (PMIC) comprising a voltage generation circuit configured to:
receive a plurality of target voltage indications each corresponding to a respective one of a plurality of voltage modulation intervals, wherein:
each of the plurality of voltage modulation intervals has a duration of an orthogonal frequency division multiplexing (OFDM) symbol and is divided into a plurality of voltage modulation subintervals each shorter than the duration of the OFDM symbol; and
each of the plurality of target voltage indications comprises a plurality of voltage targets each setting a voltage target for a respective one of the plurality of voltage modulation subintervals within the respective one of the plurality of voltage modulation intervals; and
generate a plurality of modulated voltages in the plurality of voltage modulation subintervals based on the voltage target set in the plurality of voltage targets, respectively; and
a transceiver circuit coupled to the PMIC and configured to generate and provide the plurality of target voltage indications to the PMIC.

9. The transmission circuit of claim 8, wherein the PMIC further comprises:
an inter-chip interface coupled to the transceiver circuit to receive each of the plurality of target voltage indications prior to the respective one of the plurality of voltage modulation intervals; and
a memory circuit configured to store the plurality of received target voltage indications.

10. The transmission circuit of claim 8, wherein the transceiver circuit is further configured to:
divide each of the plurality of voltage modulation intervals into the plurality of voltage modulation subintervals;
determine the plurality of voltage targets for the plurality of voltage modulation subintervals, respectively; and
provide each of the plurality of target voltage indications to the PMIC prior to the respective one of the plurality of voltage modulation intervals.

11. The transmission circuit of claim 10, wherein the transceiver circuit is further configured to provide a corresponding one of the plurality of target voltage indications for the respective one of the of the plurality of voltage modulation intervals to the PMIC during one of the plurality of voltage modulation intervals immediately preceding the respective one of the plurality of voltage modulation intervals.

12. The transmission circuit of claim 10, wherein the transceiver circuit is further configured to equally divide each of the plurality of voltage modulation intervals into the plurality of voltage modulation subintervals.

13. The transmission circuit of claim 10, wherein the transceiver circuit is further configured to unequally divide each of the plurality of voltage modulation intervals into the plurality of voltage modulation subintervals.

14. A method for enabling intra-symbol voltage modulation comprising:
receiving a plurality of target voltage indications each corresponding to a respective one of a plurality of voltage modulation intervals, wherein:
each of the plurality of voltage modulation intervals has a duration of an orthogonal frequency division multiplexing (OFDM) symbol and is divided into a plurality of voltage modulation subintervals each shorter than the duration of the OFDM symbol; and
each of the plurality of target voltage indications comprises a plurality of voltage targets each setting a voltage target for a respective one of the plurality of voltage modulation subintervals within the respective one of the plurality of voltage modulation intervals; and
generating a plurality of modulated voltages in the plurality of voltage modulation subintervals based on the voltage target set in the plurality of voltage targets, respectively.

15. The method of claim 14, further comprising:
generating a respective one of the plurality of modulated voltages prior to the respective start of the respective one of the plurality of voltage modulation subintervals in response to the respective one of the plurality of voltage targets indicating that the respective one of the plurality of modulated voltages will increase during the respective one of the plurality of voltage modulation subintervals; and generating the respective one of the plurality of modulated voltages at the respective start of the respective one of the plurality of voltage modulation subintervals in response to the respective one of the plurality of voltage targets indicating that the respective one of the plurality of modulated voltages will decrease during the respective one of the plurality of voltage modulation subintervals.

16. The method of claim 14, further comprising:

dividing each of the plurality of voltage modulation intervals into the plurality of voltage modulation subintervals;

determining the plurality of voltage targets for the plurality of voltage modulation subintervals, respectively; and receiving each of the plurality of target voltage indications prior to the respective one of the plurality of voltage modulation intervals.

17. The method of claim 16, further comprising receiving a corresponding one of the plurality of target voltage indications for the respective one of the of the plurality of voltage modulation intervals during one of the plurality of voltage modulation intervals immediately preceding the respective one of the plurality of voltage modulation intervals.

18. The method of claim 16, further comprising equally dividing each of the plurality of voltage modulation intervals into the plurality of voltage modulation subintervals.

19. The method of claim 16, further comprising unequally dividing each of the plurality of voltage modulation intervals into the plurality of voltage modulation subintervals.

\* \* \* \* \*